United States Patent [19]

Batchelder et al.

[11] Patent Number: 4,969,198

[45] Date of Patent: * Nov. 6, 1990

[54] SYSTEM FOR AUTOMATIC INSPECTION OF PERIODIC PATTERNS

[75] Inventors: John S. Batchelder, Tarrytown; Raymond E. Bonner, Yorktown Heights; Byron E. Dom, North Salem; Robert S. Jaffe, Shenorock, all of N.Y.

[73] Assignee: International Business Machines Corporation, Armonk, N.Y.

[*] Notice: The portion of the term of this patent subsequent to Sep. 13, 2005 has been disclaimed.

[21] Appl. No.: 194,610

[22] Filed: May 16, 1988

Related U.S. Application Data

[63] Continuation of Ser. No. 853,100, Apr. 17, 1986, Pat. No. 4,771,468.

[51] Int. Cl.$^5$ ............................................. G06K 9/00
[52] U.S. Cl. ......................................... 382/8; 382/27; 382/50
[58] Field of Search ................ 382/8, 27, 50; 358/106; 356/237

[56] References Cited

U.S. PATENT DOCUMENTS

| | | | |
|---|---|---|---|
| 4,047,152 | 9/1977 | Giuliano | 382/50 |
| 4,428,672 | 1/1984 | Allard et al. | 356/237 |
| 4,448,532 | 5/1984 | Joseph et al. | 356/237 |
| 4,463,373 | 7/1984 | Mikami | 358/106 |
| 4,532,650 | 7/1985 | Wihl et al. | 382/8 |
| 4,628,531 | 12/1986 | Okamoto | 382/34 |

*Primary Examiner*—Leo H. Boudreau
*Assistant Examiner*—Michael R. Cammarata
*Attorney, Agent, or Firm*—Philip J. Feig

[57] ABSTRACT

A method and apparatus for automatic inspection of periodic patterns typically found on patterned silicon wafers, printed circuit board, and the like is disclosed herein. The method comprises an inspection algorithm of two parts: a low-level algorithm and a higher level algorithm. The low-level algorithm utilizes the known periodically of the pattern to find defects by comparing identical cells in the periodic array. The high-level algorithm applies the low-level algorithm, some number of times (N) in succession on the image; accumulates defective pixels to form a separate image; and then applies a threshold-sort operation on a neighborhood to determine center pixel defectiveness.

The apparatus for implementing the above method comprises a parallel/pipeline architecture for high speed processing and RAM LUT's to implement a plurality of subtract and compare functions.

22 Claims, 10 Drawing Sheets

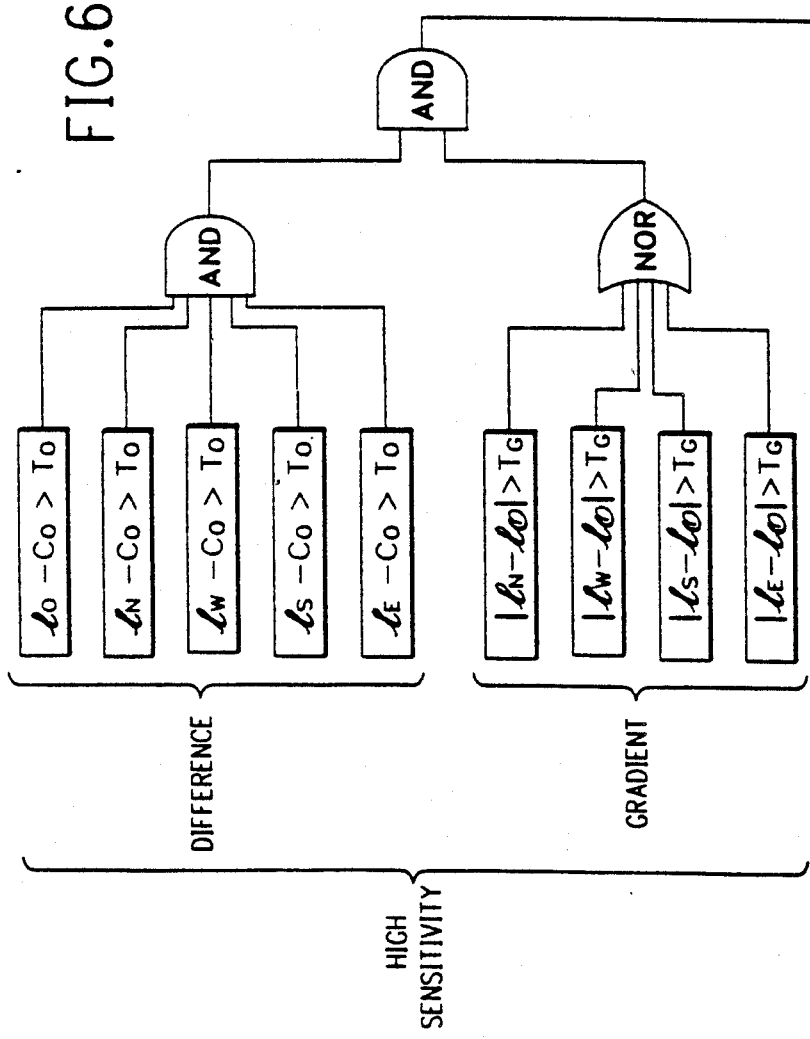

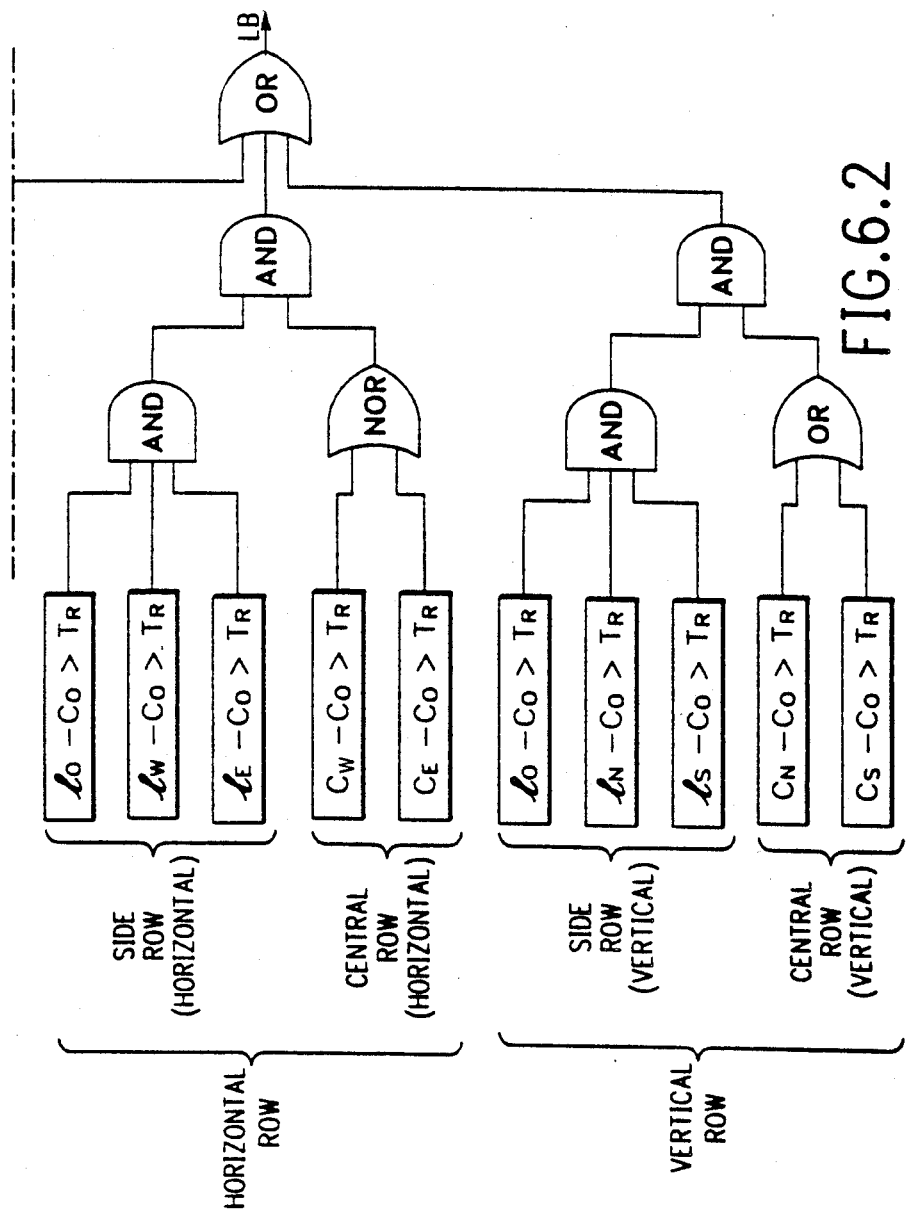
FIG.6.2

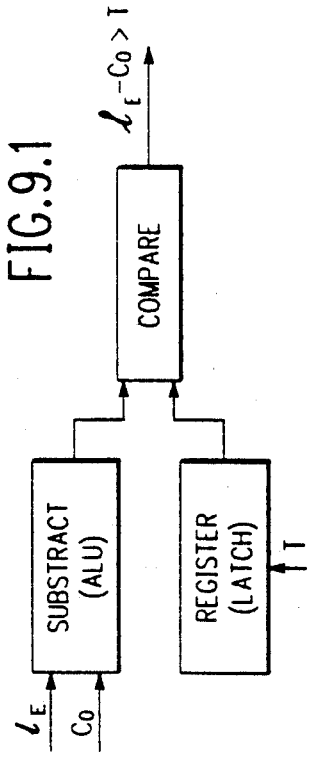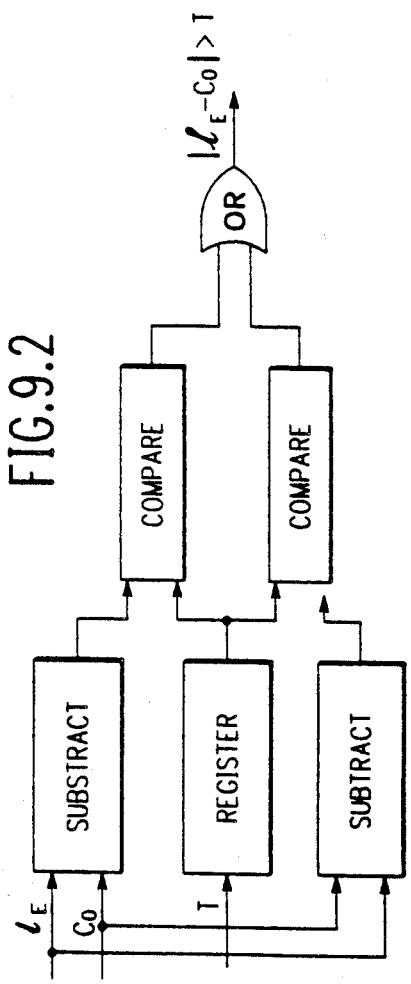

SYSTEM FOR AUTOMATIC INSPECTION OF PERIODIC PATTERNS

This is a continuation of application Ser. No. 06/853,100, filed Apr. 17, 1986, now U.S. Pat. No. 4,771,468.

BACKGROUND OF THE INVENTION

1. Field of the Invention

This invention relates to a method and apparatus for the automatic inspection of periodic patterns such as memory arrays and programmable logic arrays in integrated circuit chips and the like. More particularly, this invention relates to a method and apparatus for the automatic inspection of periodic patterns in the above devices wherein the known periodicity of the pattern is used to identify defects by comparing repetitive cells in the periodic array.

2. Description of Related Art

While complex periodic patterns, such as memory arrays and programmable logic arrays in integrated circuit chips, have become increasingly smaller to effect larger data capacity in denser package designs, improved inspection techniques for the arrays have failed to be developed. Historically, and as is still the case, inspection is largely accomplished by microscopic examination of the pattern. However, this technique is extremely slow, costly, operator fatiguing and at low quality levels.

To meet this demand, many automatic inspection systems have been developed to carry out the task of inspecting complex structures by analyzing two dimensional images of those structures. In electronics manufacturing applications, these structures usually consist of complicated arrays of fairly simple geometric patterns. Examples of these are printed circuit boards (both bare and populated), masks for photolithography and patterned silicon wafers (IC chips during the manufacturing process). Most systems that perform this type of inspection use one or a combination of two approaches: image to design comparison or image to image comparison. Wherefore, it is recognized by those skilled in the art that design rule checking is not usable with patterned inspection as topographical variations and reflections due to films and edges are not incorporated.

Harris et al in "Automated Inspection of Wafer Patterns with Applications in Stepping, Projection and Direct-Write Lithography," Solid State Technology (February 1984), pp. 159-179 discloses an automated wafer inspection tool which provides three basic reference options: Wafer Reference, Standard Reference and/or Design Reference. Selected types of defects are taught to be found with these three reference options. However, no teaching as to how each inspection option works is provided.

Koniski et al in "New Technique for Inspecting Charge-Coupled Device (CCD) Wafer for Defects," SPIE, Vol. 336, Robot Vision (1982), pp. 128-132, describes a system for inspecting high density CCD wafers for surface defects.

Koniski et al technique consists of applying an edge detector to a greyscale image and then detecting defects by comparing edge points with their periodic counterparts one repetition period away. The lack of a match indicates the presence of a defect. However, the technique is quite noise sensitive and many of the details of implementation address the problem of suppressing false defect calls due to noise. The result is a technique that, is only capable of detecting defects much larger than the pixel size. Suspected defect points are found by a comparison between edge points and their counterparts one repetition period away. A suspected defect would be indicated, in this case, by a "1-10" comparison result. Using this suspected defect procedure to make the final defect determination would, however, produce unacceptably high false call rates due to noise effects, which are still present at this point in spite of the large gradient operator used.

Therefore, the use of an inherently noise sensitive technique (the gradient operator) and operations based on large neighborhoods (i.e. $5 \times 5$ and $8 \times 8$) make finding small defects difficult even in areas of uniform grey-level. Near pattern edges, finding small defects becomes impossible, especially in images of complicated multi-level patterns such as found on memory and logic circuit chips, where edges are virtually everywhere.

It is therefore an object of the present invention to provide a high speed, extremely accurate method and apparatus for the automatic inspection of complex periodic patterns in electronic manufacturing applications.

SUMMARY OF THE INVENTION

A method and apparatus for automatic inspection of periodic patterns typically found on patterned silicon wafers, printed circuit board, and/or mask for photolithography is disclosed.

The method comprises an inspection algorithm of two parts: a low-level algorithm and a higher level algorithm which includes, therein the operation of the low-level algorithm.

The low-level algorithm utilizes the known periodicity of the pattern to find defects by comparing supposedly identical cells in the periodic array. The low-level algorithm assumes horizontal (in the image) periodicity only and analyzes the greyscale identity for each pixel in the image (except those in a dead zone along the borders) by comparing it with the greyscale identity for the two pixel neighborhood, which are a pattern repetition period, R, away in either direction. In addition, the low-level algorithm includes an edge detector applied in the neighborhoods of the compared pixels and a missing pattern test for identifying vacant patterns in the array.

In basic terms, the high-level algorithm comprises applying the low-level algorithm, some number of times (N) in succession on the image. An accumulator image is formed by adding the results of the low-level algorithm to create a separate image array where the pixels relate to the number of times that the pixel in the original image was detected as defective by the low-level algorithm.

The apparatus for implementing the above method first comprises a means for digitizing a video signal of the periodic array such that the output of said means is a digital greyscale image, read out in raster scan fashion. The image then goes into a dual ported high speed memory means where the previously stored image is being read out and passed to a means for performing the method of the low-level algorithm.

This low-level algorithm means takes the greyscale image as input and produces a corresponding binary image where the ones represent suspected defect pixels and the zeros do not. This image then passes to a means that converts the binary image into a list of the image coordinates of the ones. This constitutes a valuable form of data compression since the binary image will normally be sparse. In fact, the majority of the time it will be all zeros. These coordinates are then read over the computer bus by the micro-computer, which uses them to update the accumulator array. Once the N iterations of the low-level algorithm have been executed using this pipeline, the micro-computer determines where the defective pixels (if any) are located using the high-level algorithm. The results can then be displayed to the operator by modifying those pixels in the image stored in the frame buffer, and then displaying that image on a video monitor via a D/A converter (shown as part of the frame grabber).

With the low-level algorithm means; digital greyscale data enters into a delay line, which provides the fifteen pixels in parallel to a network that routes the values to the appropriate inputs of the various subtract-and-compare units (SACS). Each of the SACs produces a boolean result and are implemented by look-up table RAMs. The results are combined by a logic network that also includes two missing pattern tests. The final result of the boolean combinations is a single boolean value, which constitutes one pixel in a binary image in this case.

The foregoing and other objects, features and advantages of the invention will be apparent from the following more particular description of the invention as illustrated in the accompanying drawings.

BRIEF DESCRIPTION OF THE DRAWINGS

FIGS. 6.1 and 6.2 are a graphic depiction of the boolean combination of the left/black test of FIG. 4.

FIGS. 9.1 and 9.2 are flow charts depicting the implementation of subtract and compare (SACs) units using subtracters (ALUs), comparators and gates.

DETAILED DESCRIPTION OF THE PREFERRED EMBODIMENT

While the system described herein is intended for the inspection of integrated circuit chips on patterned wafers, it should be recognized by those skilled in the art that the same methodology and much of the system architecture can be used for inspecting any periodic structures.

Figure 1:
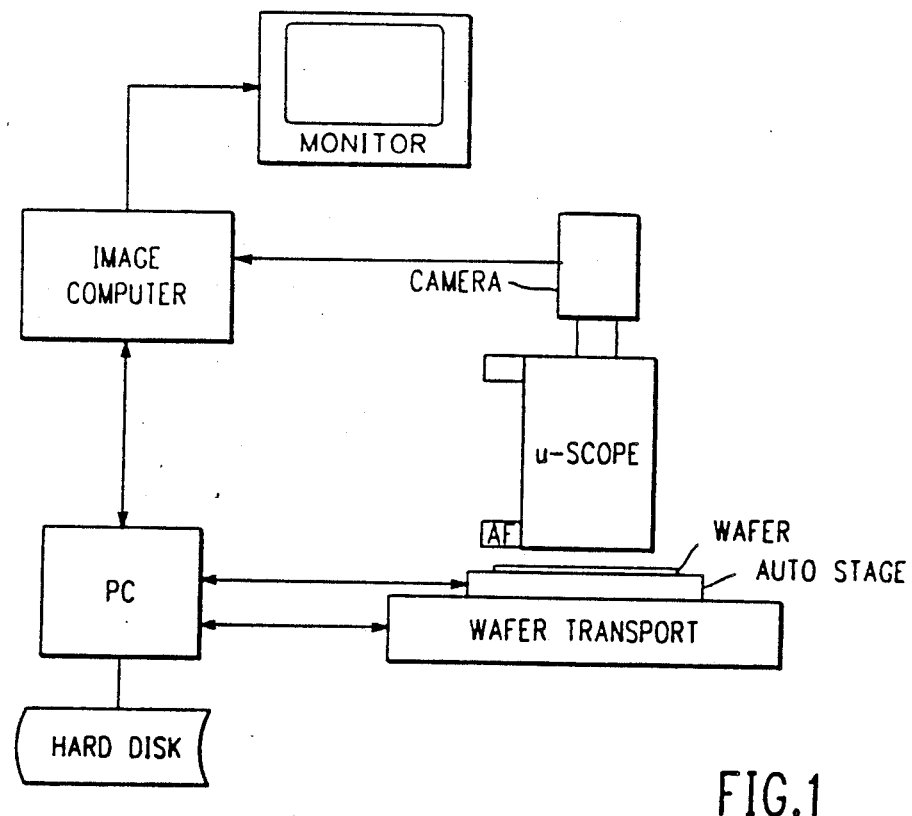
FIG. 1 is a block diagram showing the integration of the various components in a typical circuit inspection system.

A block diagram of the inspection system is shown in FIG. 1. Referring to FIG. 1, there is shown an automated inspection station providing microscope optics and computer controlled wafer handling means as well as, microscope function control for things like light intensity and autofocus offset. Low numerical aperture illumination is used to maximize contrast and a solid state video camera (for low geometric distortion) is mounted on the trinocular microscope head. The camera is used by the image analysis hardware and software for performing the actual inspection operation. The camera's video signal is split, one part going to special image analysis electronics as part of the image computer where the signal is digitized and analyzed as will be described below. The entire system is controlled by the micro-computer (shown in FIG. 8) which also performs the inspection algorithms.

In operation, the image analysis part of the system uses a high speed video pipeline to do the processing. The analog signal coming from the video camera is digitized in one frame time (for RS 170 this is 0.033 sec) and fed to the rest of the pipeline at a rate of 10 megapixels per second. This produces a 512×512 pixel digital image. In all discussions that follow this particular image form will be assumed.

Figure 2:
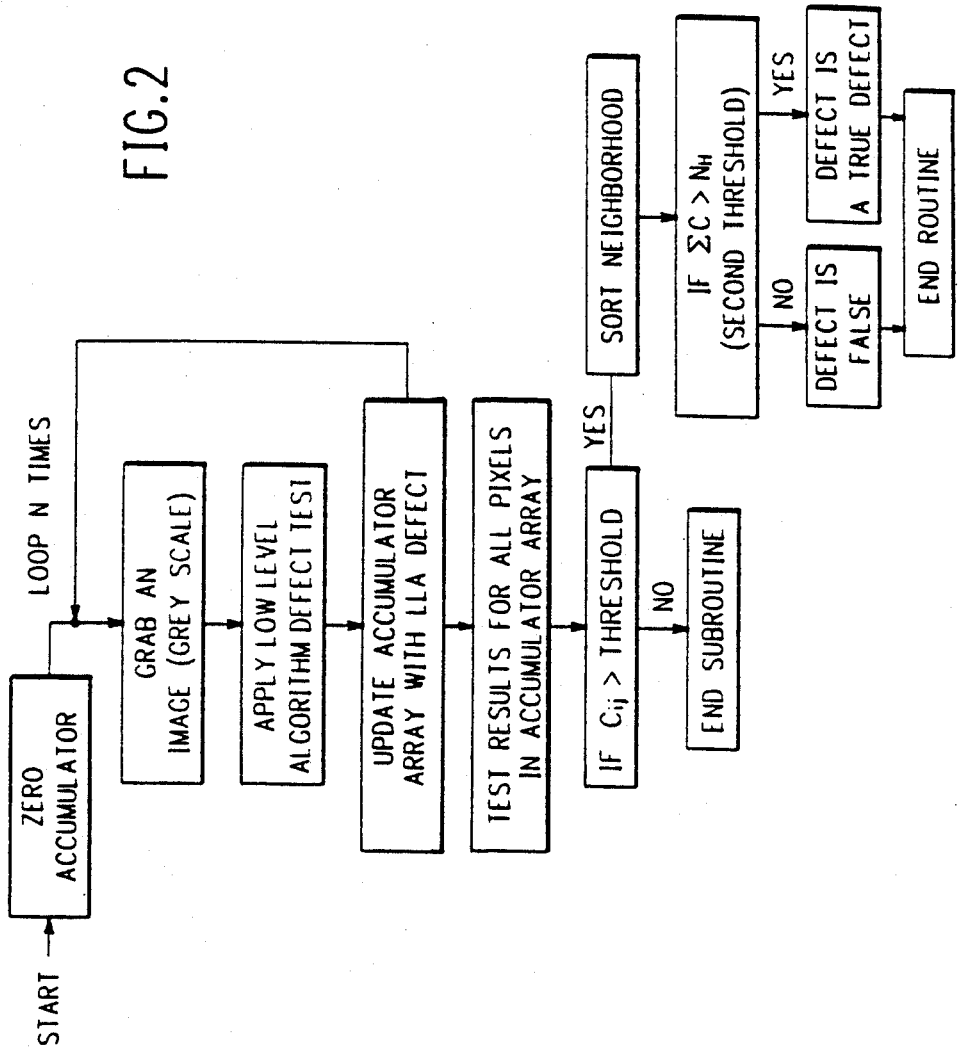
FIG. 2 is a flow chart for carrying out the high-level algorithm.

Referring now to FIG. 2, there is shown a flow chart for the high-level algorithm of the inspection system. As can be seen from the FIG. 2, digital images of the same optical image are acquired some number of times N. Next, a low-level defect test (to be described below) is applied to each of these images. This test produces a binary image where ones correspond to suspected defect pixels and all other pixels are set to zero.

Then, the results of the low-level tests are added to an accumulator image (array) corresponding pixel-wise to the digital images. At the end of the process for a given optical image (N digital images) the pixels in the accumulator image will contain values ranging from 0 to N.

Once this accumulation process is complete, a statistical test, is applied to each pixel in the accumulator image to decide whether that pixel is a defect or not.

Figure 3:
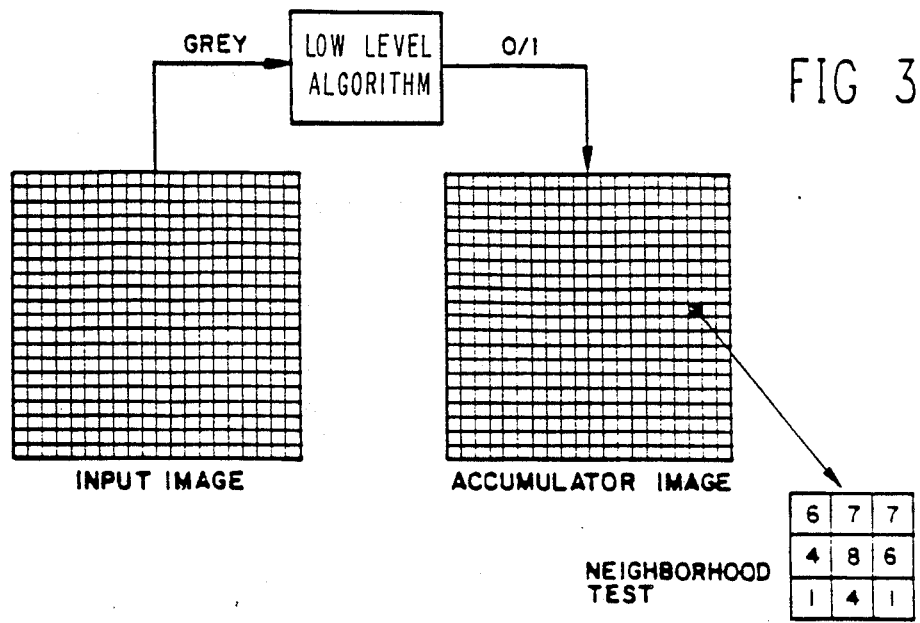
FIG. 3 is a graphic depiction for carrying out the low-level algorithm.

This accumulation process and its results are depicted symbolically in FIG. 3 where each box represents a matrix of 3×3 pixels or nine pixel group. Each number N in the matrix corresponding to the number of times a certain pixel was indicated as a suspected defect.

Continuing with FIG. 2, the high-level algorithm applies a statistical test to the pixels of the accumulator image containing sums of low-level test results for N iterations. In the simplest case (one iteration) this test is simply an identity operation on the low-level test result. For most cases, however, the false detection rate can be significantly reduced (with little effect on the defect escape rate) by applying the low-level test several times in succession. This results in the accumulator image's pixels having values from 0 to N. These values may be viewed as estimates of the probability of a given pixel being defective. It is found that the type of instabilities that cause false detections on a given digitization of an optical image do not tend to reappear on successive digitizations, at least not as frequently as real defects. The simplest form of the high-level algorithm for multiple digitizations is to apply a threshold to the accumulator image, causing those pixels that had "true" test results at least $N_H$ (count threshold for the high level test) times to be called defective.

A general form of the high-level algorithm involves not only the pixel under test but its eight nearest neighbors as well. The primary purpose of this test is to handle another type of false defect which is due to real but acceptable differences in the pattern being inspected. An example of this might be something like a texture (mottled) background which is often referred to using names like "orange peel." The following parameters applied by the low-level algorithm allows the trade-off between the smallest detectable defect size and false detection rates in such cases. The pixels of the neighborhood comprising the pixel under test and its eight nearest neighbors can be sorted and the sum, S, of the largest number of pixels considered in the high-level algorithm is compared with the threshold $N_H$. If S is greater than or equal to $N_H$ then the central pixel is called a defect.

The following is a list of the parameters of the low-level algorithm for controlling the identification of defects by the high-level algorithm.

I. N: The number of digitization per optical image.
II. $T_D$: High sensitivity difference test threshold.
III. $T_G$: Gradient test threshold.
IV. $T_R$: Row test threshold.
V. $N_M$: Missing pattern test threshold.
VI. $N_P$: The number of pixels considered in the high-level test.
VII. $N_H$: Count threshold for the high-level test.

The exact definition and operation of these parameters are described below regarding the low-level algorithm.

The low-level algorithm utilizes the known periodicity of the pattern to find defects by comparing supposedly identical cells in the periodic array. The low-level algorithm assumes horizontal (in the image) periodicity only and analyzes each pixel in the image (except those in a dead zone along the borders) by comparing it with the two pixels one pattern repetition period, R, away in either direction. The pixel under test is compared with periodic neighbors on either side in order to determine which pixel is defective when an error is detected. This also produces the benefit of eliminating false defect detection due to slowly varying illumination (shading). If the array being inspected and the images of it being analyzed could be assumed perfectly periodic except for defects, then the inspection algorithm could consist of simply comparing the pixel under test with these two pixels and flagging detected differences as defects. The realities of acceptable pattern differences and image acquisition system noise and distortion require a considerably more complicated algorithm, however.

Figure 4:
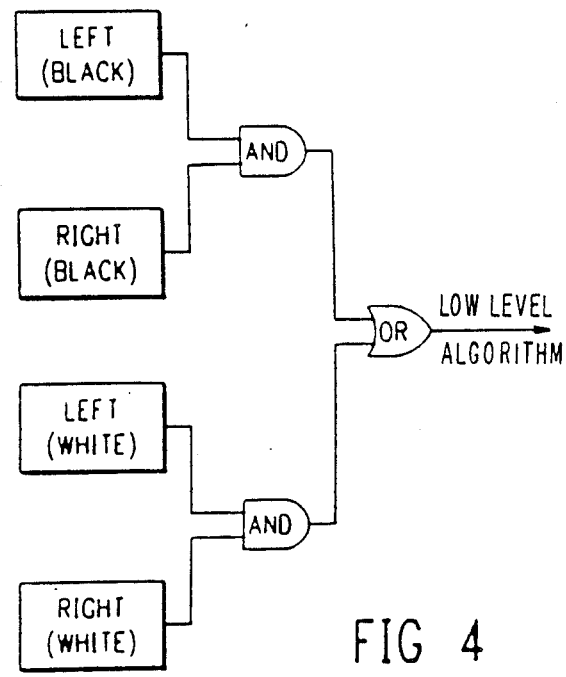
FIG. 4 is a flow chart for carrying out the low-level algorithm.

Referring now to FIG. 4, a supplied flow for the low-level algorithm is shown. From the FIG. 4, it can be seen that if a pixel is blacker than both its left and right neighbors R pixels away or if it is whiter than both of those neighbors, then its called a suspected defect and assigned a "1" in the binary image. The terms "blacker than" and "whiter than" will be defined more precisely as this description progresses.

Figure 5:
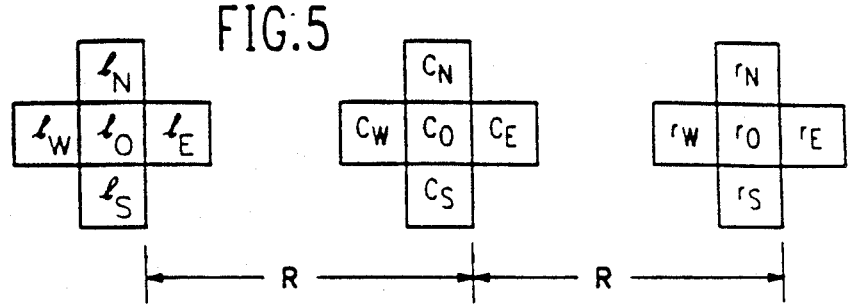
FIG. 5 is a graphic depiction of the pixel neighborhoods for use with the low-level algorithm.

FIG. 5 is a graphic depiction of fifteen pixels used in one embodiment of an inspection scheme for the low-level algorithm.

The notation used in FIG. 5 will be used throughout this discussion. The pixel under test is the one labeled $c_0$ while its left and right periodic neighbors are labeled $l_0$ and $r_0$ respectively. In the discussion that follows the three five connected pixel groups in FIG. 5 will be referred to as the left hand, central and right hand crosses.

Each of the four tests shown in FIG. 4 is composed of a boolean combination of the results of 18 subtract-and-compare operations as depicted in FIG. 6.1, which is one of these combinations (left/black) expanded.

From FIG. 4, it appears as if there should be 19 subtract-and-compare operations but two of these operations are really the same namely $l_0 - c_0 > T_R$ (described above). Since the reason for depiction of 18 combinations in FIG. 6.2.

The structure of the other three comparisons of FIG. 4 (right/black, left/white, right/white) is exactly the same as FIG. 6.2, only differences being in the sign of the comparison (for "white" tests) and the pixels used (for "right" tests). It should be noted that the two black test results are inputs to an additional test called the "missing pattern test," which is not shown in FIG. 6.2. This will be described in more detail below.

Each subtract-and-compare operation consists of taking the difference between two pixel grey levels and comparing it or its absolute value with a threshold, thus producing a boolean result. As shown in FIG. 6.2 the result of each of the four tests is obtained by ORing the results of three sub-tests, each of which may be further decomposed into two tests. From top to bottom in the FIGURE, the three tests are: high sensitivity comparison test, horizontal row test and vertical row test. As the name implies the high sensitivity test is the most sensitive, having the smallest grey-level comparison threshold, but it gives false indications in regions of high gradient (i.e. on edges). The solution to this is to "turn off" the test in regions of high gradient. Thus the two tests making up the high sensitivity test are:

A. difference test: As can be seen from the FIGURE, this test is true if the pixel under test is less than all five of the pixels in the left hand cross of FIG. 5 by the threshold $T_o$,
B. gradient test: This test looks for a high gradient within the left hand cross. The test produces a false result if the absolute difference between the central pixel of the left hand cross, $l_0$, and any of its four-connected neighbors exceeds the threshold $T_G$.

The horizontal row test is somewhat lower sensitivity, but is capable of detecting defects on horizontally oriented edges. This test result is formed by ANDing the results of the following two tests:

A. side row test: This test result is true if the pixel under test is less than all three of the pixels forming the horizontal bar on the left hand cross by the threshold $T_R$.
B. central horizontal row test: This test is used to reduce false detections. Its function is to allow the horizontal row test to detect a defect only if $c_0$ is on a horizontally oriented edge (i.e. the edge of the defect). This means that some of the pixels within the defect may not be detected, which causes no problem since the edge pixels will be detected. The test produces a true result if $c_0$ is less than either of its east-west neighbors, $c_w$ and $c_e$.

The vertical row test is identical in structure to the horizontal row test, except that it considers north-south pixels.

In the difference and side row tests the central pixel is compared with several pixels (either 5 or 3) in one of the side crosses to ensure that random variations do not cause a false detection. In both these cases it is assumed that there is little variation within the pixels being compared with the central pixel. In the difference test a uniform area is assumed while in the side row test the pixels are assumed to lie along a greyscale contour line parallel to an edge.

While the algorithm as described up to now works quite well for small isolated defects, the requirement that the difference between $c_0$ and the other pixels be similar on both sides for it to be flagged as a suspected defect may cause certain types of gross defects to be missed entirely. These are defects whose horizontal extent is greater than the pattern period, R. An example of such a defect would be a row of several cells where some part of the pattern is missing. In fact this is the most common and bothersome defect of this type encountered in patterned wafer inspection.

Figure 7:
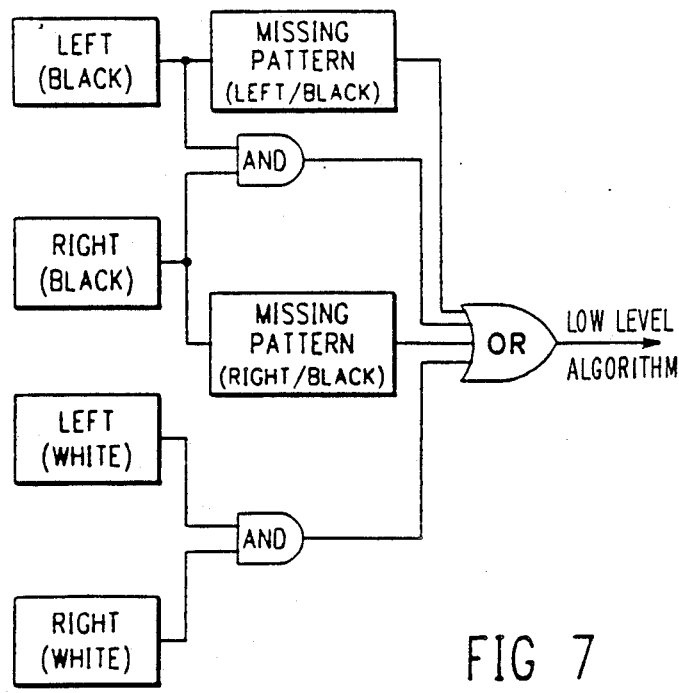
FIG. 7 is the flow chart for the low-level algorithm of FIG. 4 with the missing pattern test added.

The missing pattern test is performed by tracking the results of the left/black and right/black tests and flagging a suspected defect if either test result is true for some number, $N_M$, of horizontally consecutive pixels. More precisely, a counter is maintained for each of the two black tests. Each time the test result is true, the counter is incremented and every time the result is false the counter is cleared (set to zero). The counters are examined after each iteration and the current pixel under test, $c_0$, is flagged (set to one) if the counter value is greater than or equal to $N_M$. The way the missing pattern test fits in with the rest structure is shown in FIG. 7, which is FIG. 4 with the logic diagram for the missing pattern added.

While, as thus far described, the low level algorithm has been shown to operate for the horizontal and vertical rows of these pixel neighborhoods, it should be recognized by those skilled in the art that the diagonal rows of these neighborhoods could be similarly incorporated for assessing suspected defects. These diagonal row tests would follow directly the methodology and comparisons as stated above for the horizontal and vertical rows. Thus, with the horizontal and vertical row tests, there would be 4 corrected pixel neighbors to the central pixel; while by including the diagonal row test, there would be 8.

Figure 8:
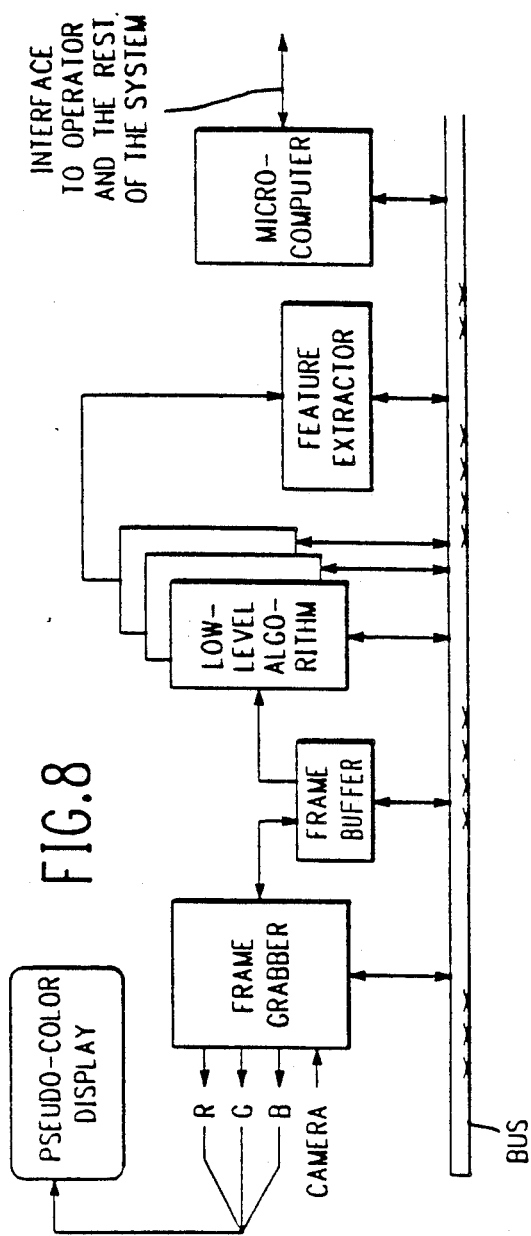
FIG. 8 is a block diagram, of the hardware implementation of the high-level and low-level inspection algorithm.

Referring now to FIG. 8, there is a block diagram of the image analysis electronics of this invention. In the FIG. 8, it should be understood that a high speed video pipeline is shown where data flows from left to right to the FIGURE. Hereinafter, this pipeline will be referred to as the image computer.

In the FIG. 8, the modules are linked by high speed 8 bit wide data paths and they are also all attached to a computer bus along with a micro-computer that controls the modules via the bus as well as performing the high-level algorithm and controlling the rest of the system. The modules all operate in parallel in typical pipeline fashion. Working from left to right in the FIGURE, the video signal is first digitized by a high speed analog-to-digital converter frame grabber, whose output is a digital greyscale image, read out in raster scan fashion. This image then goes into a dual ported high speed memory frame buffer, while the previous image is being read out and passed to a module that performs the low-level algorithm as described above. The frame buffer is not required for the automatic inspection process, but it is needed for the review phase where the system uses the buffer to display the inspection results.

The low level algorithm therefore, takes the greyscale image as input and produces a corresponding binary image where the ones represent suspected defect pixels and the zeros do not. This image then passes to a module that converts the binary image into a list of the image coordinates of the ones. This constitutes a valuable form of data compression since the binary image will normally be sparse. In fact the majority of the time it will be all zeros. These coordinates are then read over the computer bus by the micro-computer, which uses them to update the accumulator array. Once the N iterations of the low-level algorithm have been executed using this pipeline the micro-computer determines where the defective pixels (if any) are located using the high-level algorithm. The results can then be displayed to the operator by modifying those pixels in the image stored in the frame buffer, and then displaying that image on a video monitor via a D/A converter (shown as part of the frame grabber).

During system operation, the image computer is programmed by the micro-computer as follows. First, when a new product/level is to be inspected, the low-level algorithm module is programmed with the pattern repetition period and the various thresholds. Then, once the microscope stage has been stepped so that a new image may be acquired and analyzed, all the boards are put in "continuous" mode which means that images are continuously acquired and passed through the pipeline at video rate (30 frames/sec). This must be done in a way that causes N images to be processed and the system to then stop. Once the last image of a given set has been acquired, the system control program may then step the stage to the next field to be processed. While the stage is moving the last image is processed by the image computer and the micro-computer performs the high-level algorithm test. There must also be some synchronization between the feature extractor processing and the micro-computer, so that the micro-computer can retrieve the detected pixel locations before the next frame has been processed.

While the overall structure described in FIG. 8 is unique for this system, versions of all but one of the individual modules shown may be obtained commercially. This unique module is the low-level algorithm module. The operational structure of that module is essentially given by FIG. 4. Each of the four boxes in this FIGURE and the missing pattern test will be expanded and described in detail below.

Figure 10:
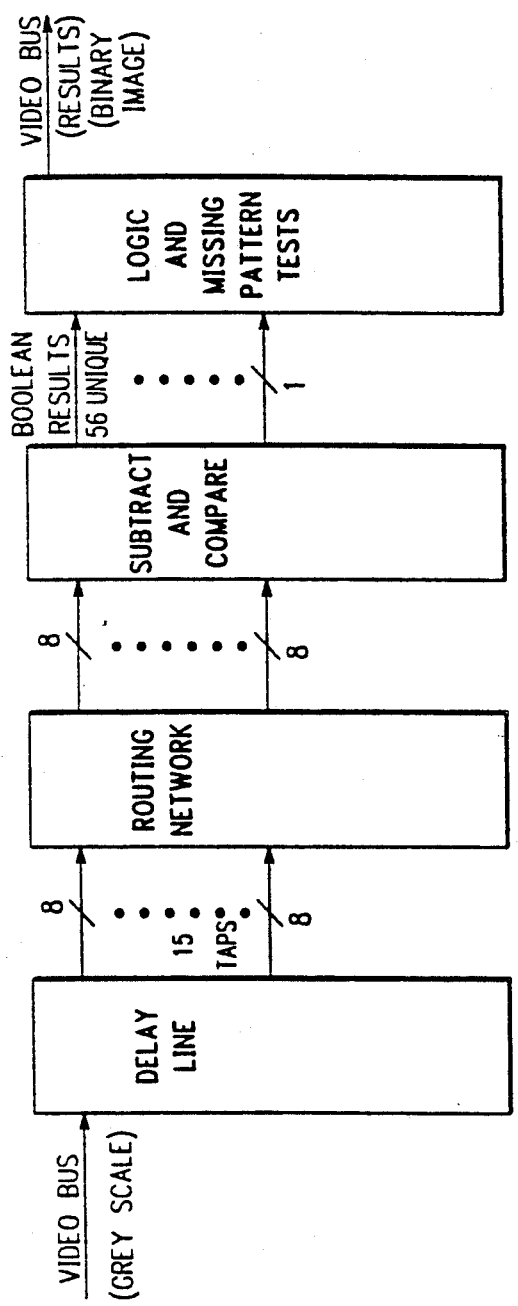
FIG. 10 is a block diagram of one possible hardware embodiment of an apparatus for performing the low-level algorithm.

One scheme for partitioning the low-level algorithm module is shown in FIG. 10. This FIGURE shows digital greyscale data entering a delay line, which provides the fifteen pixels in parallel to a network that routes the values to the appropriate inputs of the various subtract-and-compare units (SACs). Each of the SACs produces a boolean result. An analysis of the algorithm shows that there is a total of 56 unique results of this type, which are combined by a logic network that also includes the two missing pattern tests. The final result of the boolean combinations is a single boolean value, which constitutes one pixel in a binary image in this case.

As is clear from the structure indicated above in FIG. 10, much of the computation required in the low-level algorithm may be done in parallel. In order for this to occur, the fifteen pixels shown in FIG. 5 must all be available simultaneously. In the invention, this will be achieved using a delay line with fifteen taps. For a given pattern repetition period the delay line must be $2M+2R$ long, where M is the number of pixels per scan (512 in this case). For flexible use the tap locations must be programmable and the delay line must be $2M+2R_{max}$ long. Such a delay might be implemented by stringing together programmable first-in-first-out memories (FIFOs) or by using programmable counters to address a RAM buffer, for example.

It should be recognized by those skilled in the art that each of the rectangular boxes in FIG. 6.2 performs the operations of:

I. subtracting two greyscale values,
II. sometimes taking the absolute value of the result,
III. comparing the result with a threshold and
IV. producing a boolean value based on the result of that comparison.

One means of implementing these operations is by using subtracters (ALUs), comparators and gates as shown in FIG. 9.2. Another means of implementing these functions is by using RAM look-up tables (LUTs). A LUT may be used to implementing any boolean function of two greyscale variables, by applying the two n-bit greyscale values to the address lines of a $2^{2n} \times 1$ bit RAM while asserting the "read" line, thus producing the boolean result (which had been previously stored in the RAM) on the "data" line. The advantages of this implementation are the reduced chip count (1 for LUT vs. at least 3 for subtracters, comparators, etc.) and increased flexibility (any boolean function of two greyscale variables may be programmed). The primary disadvantage is that programming a detection threshold requires programming an entire RAM. A scheme for doing this programming in a minimal amount of time will be described below. The LUT scheme will be embodied herein.

Figure 11:
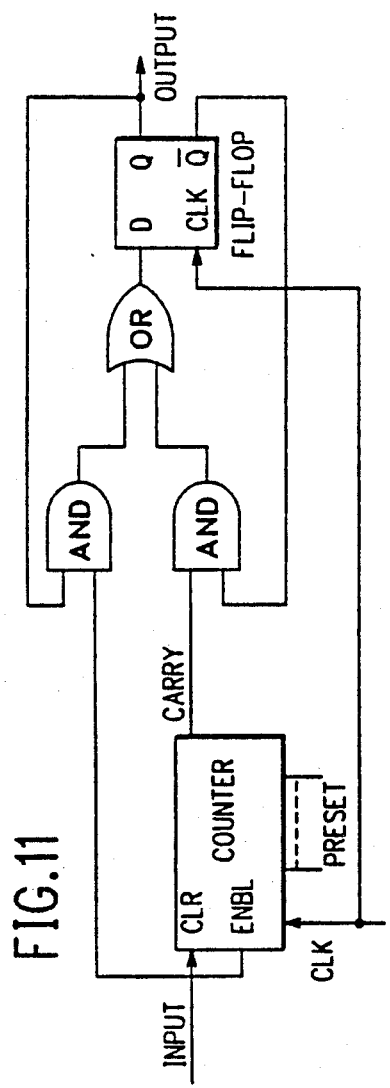
FIG. 11 is a block diagram for the hardware implementation of the missing pattern test.

The missing pattern test fits in with the rest of the low-level algorithm as shown in FIG. 7. As described in relation thereto, its function is to count positive results from either of the black tests, producing a positive output whenever it has encountered $N_M$ consecutive positive inputs. A possible implementation of this is shown in FIG. 11. During programming, a preset value is loaded into a self-presetting counter. During run mode, true inputs enable the counter, allowing it to count clock pulses. When the counter overflows the logic shown causes the D flip-flop's Q output to be asserted indicated a true result for the missing pattern test. As long as the circuit's input remains true, Q will remain true. As soon as the input goes false, however, the counter will be cleared/preset and Q will become false and stay false until the counter overflows again.

Having thus described the operational structure and partitioning scheme, it should be readily apparent therefrom that the low-level algorithm module must be programmed by the micro-computer with the pattern repetition period, R, the three comparison threshold $T_D$, $T_G$ and $T_R$, and the count threshold for the missing pattern test, $N_M$. The repetition period and the missing pattern test count threshold will be programmable by loading a presettable counter or some equally simple operation. If subtracters and comparators are used to implement the SACs, then programming the comparison thresholds is also a simple matter, consisting of simply loading a set of registers from the micro-computer bus. The comparison threshold will not be as simple to program, however, when using the LUT implementation, because of the need to program an entire RAM look-up table. The following is a description of a circuit and associated scheme for programming these LUTs in an efficient manner.

The programming problem can be described as follows. Each LUT RAM must be programmed (written) with $2^{2n}$ (64K for 8-bit greyscale) binary values. The desirable elements of a programming scheme are:
I. some means of writing values into the RAMs (which requires access to the address lines) from the micro-computer that doesn't add too much additional circuitry. Typically programming a RAM is done by stepping through its address space, while placing the data to be written into the RAM onto the "data-in" line and strobing the "write" line at each address.
II. a programming scheme associated with this circuitry that allows programming the RAMs in a reasonable number of steps, keeping programming time at an acceptable level.

As described thus far the only access provided to the RAM address lines is through the delay line taps, which provide the pixel greyscale values during run mode. Also, as described thus far, the only way for the micro-computer can place values there is by loading them into the frame buffer via the computer bus and then clocking them into the low-level algorithm module delay line over the high speed video bus. While the LUTs could be programmed this way, in principle, it would be a very complicated and time consuming process.

An analysis of the algorithm reveals that there are in fact only five unique LUT patterns, which are duplicated multiple times to make up the 56 LUTs required to perform the test. These five patterns are: the white and black difference tests, the white and black row tests, and the gradient test.

Despite the fact that there are only five unique patterns. All of them must be used on different sets of inputs simultaneously resulting in the need for 56 actual LUT RAMs.

One way of taking advantage of this would be to "dual port" the RAM by 2:1 multiplexing all of the address lines, with one set of inputs to the multiplexors coming from the delay line taps and the other coming from the computer bus address lines. If the data-in lines of the RAMs were then connected to one of five (one for each unique pattern) data lines on the computer bus, the LUTs could be programmed by looping through all of the RAM addresses and writing one byte (of which only five bits would be used) for each address. Unfortunately, this would require the addition of a large number of chips just to implement the multiplexing scheme. If 8-bit greyscale were to be used, there would be a total of $56 \times 16 = 896$ address lines to be 2:1 multiplexed.

Figure 12:
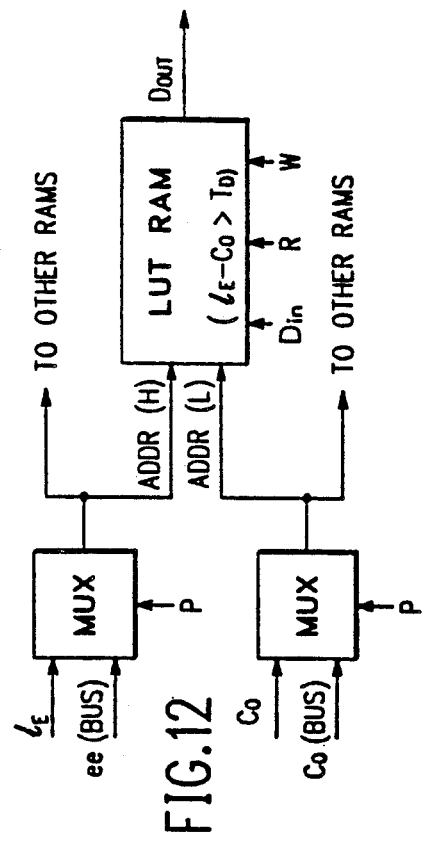
FIG. 12 is a block diagram for multiplexing of delay line taps for look-up-table (LUT) addressing during program and run nodes.

This multiplexing scheme may be greatly simplified for all but the gradient test LUTs by multiplexing the delay line taps in the routing network rather than multiplexing the RAM address lines directly. This is diagrammed in FIG. 12 which shows one LUT from the left-black test ($l_E - c_0 > T_D$) and its associated delay line taps and multiplexors (MUXs). This works because these LUTs involve a difference between $c_0$ and some other pixel. Thus the multiplexing scheme can multiplex the $c_0$ tap with another set of lines (greyscale value) coming from the computer bus and all other taps can be multiplexed with another single value (call it "ee" for "everything else"). The various signal lines shown in the FIGURE and their function during the run and program modes may be described as follows:
I. The lines labeled $l_E$ and $c_0$ come from the associated delay line taps. These are connected with the MUX outputs during run mode.
II. The lines ee(BUS) and $c_0$(BUS) come from the high and low order computer bus address lines respectively and will pass through to the MUX outputs during program mode.
III. The P (for "program") input to the MUXs, which is asserted during program mode and unasserted during run mode, comes from some latch set from the computer bus. This line determines which set of multiplexor inputs is connected with the outputs.

IV. The $D_{in}$ (data in) input to the RAM comes from one of the bus data lines. Values to be written into the RAM during program mode are placed here.

V. The $D_{out}$ (data out) line is where the boolean result appears during run mode.

VI. The R (for "read") line can just be the $\bar{P}$ line inverted, P. When this is asserted, the LUT result for the values present on the address lines will appear on the $D_{out}$ line.

VII. The W (for "write") line must be strobed, once stable signals are present on the $D_{in}$ and address lines, when programming the RAM. This signal must be derived from the appropriate bus line with adequate time delay provided.

Using this scheme, all the LUTs involving $c_0$ can be programmed in one pass through the RAM address space. One might think of doing this with two nested loops where $c_0$ values are stepped through in the outer loop while the ee (for "everything else") values are stepped through in the inner loop. The instructions executed within these loops would determine the values of the various bits and write them to the appropriate memory location. Unfortunately, the LUTs not involving $c_0$ (namely the gradient tests) cannot be programmed with this scheme because all other MUX program inputs are from the ee lines. That is, while the LUTs involving $c_0$ are being programmed, $l_0$ and $r_0$ must be stepped through the same addresses and in the same sequence as the other pixel values. This means that in the left gradient test, for example $|l_E - l_0| > T_G$ LUT can only be programmed at those $2^n$ values for which $l_E = l_0$. This problem is solved by adding two additional MUXs, one each of $l_0$ and $r_0$. These two MUXs have the $l_0$ or $r_0$ tap as their run mode input but their program mode input comes from $c_0$. The outputs of these MUXs go to the low order address lines of the appropriate gradient test LUTs, while the other $l_0$ and $r_0$ MUX outputs go to the appropriate difference and row test LUTs. Using this scheme, the entire 56 LUT array may be programmed with one pass through the $2^{2n}$ addresses (for n-bit greyscale).

Thus, while the invention has been described with reference to preferred embodiments thereof, it will be understood by those skilled in the art that various changes in form and details may be made without departing from the scope of the invention.

Having thus described our invention, what we claim as new, and desire to secure by Letters Patent is:

1. In a system for the automatic inspection of two dimensional periodic patterns on printed circuit boards, photolithographic masks, patterned semiconductor wafers and the like wherein said pattern is scanned by image producing means, the improvement to said inspection system comprising:
   (a) acquiring digital images of the same optical image pattern some predetermined plurality of times, N;
   (b) applying a low-level defect test to each of said digital images by comparing pixel greyscale values a repetition period away in either direction to produce a binary image where ones correspond to suspected defect pixels and all other pixels are set to zero;
   (c) adding the results of said low-level test to form an accumulator array corresponding pixel-wise to the digital images such that for a given optical image (N digital images) the pixels in the accumulator array will contain values ranging from 0 to N;
   (d) applying a preset first threshold level to each pixel level of the accumulator array;
   (e) sorting a neighborhood of the accumulator array for central pixels above said first threshold limit;
   (f) summing the value in the accumulator array of each sorted neighborhood to obtain a sum of values of each of the pixels considered for each sorted neighborhood associated with a respective central pixel, and
   (g) applying a second threshold to said sum such that if said sum is greater than or equal to the second threshold, the associated respective central pixel is considered a defect.

2. A system according to claim 1 wherein the compared pixel greyscale value comprise three neighborhoods of pixel greyscale values a repetition period away in either direction from a center designated neighborhood.

3. A system according to claim 2 wherein the neighborhood of greyscale pixel values comprise a central pixel and its connected pixel neighbors.

4. A system according to claim 3 wherein there are four connected pixel neighbors to a central pixel 5. A system according to claim 3 wherein there are eight connected pixel neighbors to a central pixel.

6. A system according to claim 1 wherein a suspected defect pixel is a pixel either blacker than or whiter than both of its left and right neighbors.

7. A system according to claim 6 wherein the determination of a pixel neighbor as being blacker than or whiter than the central pixel comprises comparing selected predetermined pixels of the neighboring pixel group to selected predetermined pixels of the central pixel neighborhood.

8. A system according to claim 7 wherein the comparison of the selected predetermined pixels comprises a high sensitivity comparison test, a horizontal row test, a vertical row test and a missing pattern test.

9. A system according to claim 8 wherein the high sensitivity comparison test comprises:
   (a) a difference test wherein one of the neighboring pixel groups to the central pixel are compared to said central pixel and a first preset threshold, and
   (b) a gradient test wherein the center pixel of the neighbor is compared to its connected neighbors and a second preset threshold.

10. A system according to claim 8 wherein the horizontal row test comprises:
    (a) a side row test comparing each of the pixels in a horizontal row of the neighboring pixel group to the central pixel and
    (b) a central row test wherein the central pixel of the center neighborhood is compared to its horizontal row connected neighbors.

11. A system according to claim 8 wherein the vertical row test comprises:
    (a) side row test comparing each of the pixels in a vertical row of the neighboring pixel group to the central pixel and
    (b) a central row test wherein the central pixel of the center neighborhood is compared to its vertical row connected neighbors.

12. A system according to claim 8 wherein the missing pattern test comprises, comparing the left and right neighbors of the central pixel for a predetermined number of horizontally consecutive blacker than pixel results, netting a counter to mark each blacker than result and comparing said counter result to a preset threshold such that a missing pattern is indicated if the counter value is greater than or equal to the threshold.

13. In a system for automatic inspection of two dimensional periodic patterns on printed circuit boards, photolithographic masks, pattern semiconductor wafers and the like wherein said pattern is scanned by image producing means such that digital images of the same optical image pattern is acquired some predetermined plurality of times, N, and a greyscale value is assigned to said pixels so that greyscale values of the pixels in one pattern can be compared to the greyscale values of the respective pixels a repetition period away, the improvement to said inspection system comprising:
  (a) establishing three neighborhoods of pixel greyscale values a repetition period away in either direction from a center designated neighborhood
  (b) comparing said neighborhoods to said center designated neighborhood to test said respective pixels as being blacker than or whiter than said center pixels
  (c) labelling by binary code to identify a neighbor as being blacker than or whiter than its respective center neighbor, and
  (d) accumulating said labelled-by-binary-code neighbors.

14. A system according to claim 13 wherein the neighborhood of greyscale pixel values comprise a central pixel and its connected pixel neighbors.

15. A system according to claim 14 wherein there are four connected pixel neighbors to a central pixel.

16. A system according to claim 14 wherein there are eight connected pixel neighbors to a central pixel.

17. A system according to claim 13 wherein a suspected defect pixel is a pixel either blacker than or whiter than both of its left and right neighbors.

18. A system according to claim 17 wherein the determination of a pixel neighbor as being blacker than or whiter than the central pixel comprises comparing selected predetermined pixels of the neighboring pixel group to selected predetermined pixels of the central pixel neighborhood.

19. A system according to claim 18 wherein the comparison of the selected predetermined pixels comprises a high sensitivity comparison test, a horizontal row test, a vertical row test and a missing pattern test.

20. In a system for automatic inspection of two dimensional periodic patterns on printed circuit boards, photolithographic masks, pattern semiconductor wafers and the like wherein said pattern is scanned by image producing means such that digital images of the same optical image pattern is acquired some predetermined plurality of times, N, and a greyscale value is assigned to said pixels so that greyscale values of the pixels in one pattern can be compared to the greyscale values of the respective pixels a repetition period away, the improvement to said inspection system comprising:
  (a) means for establishing three neighborhoods of pixel greyscale values a repetition period away in either direction from a center designated neighborhood
  (b) means for comparing said neighborhoods to said center designated neighborhood to test said respective pixels as being blacker than or whiter than said center pixels
  (c) means for labelling by binary code to identify a neighbor as being blacker than or whiter than its respective center neighbor, and
  (d) means for accumulating said labelled-by-binary-code neighbors.

21. A system according to claim 20 wherein said means for comparing said neighborhoods comprises providing more than one pixel in parallel to a network that routes the values to the inputs of subtract and compare units.

22. A system according to claim 21 wherein the routing network multiplexes said pixels provided in parallel to create a predetermined number of greyscales values to be routed to the subtract and compare units.

* * * * *